United States Patent [19]

Ueno

[11] Patent Number: 4,972,372

[45] Date of Patent: Nov. 20, 1990

[54] PROGRAMMABLE DEVICE AND METHOD OF TESTING PROGRAMMABLE DEVICE

[75] Inventor: Kouji Ueno, Inagi, Japan

[73] Assignee: Fujitsu Limited, Kawasaki, Japan

[21] Appl. No.: 221,480

[22] Filed: Jul. 19, 1988

[30] Foreign Application Priority Data

Jul. 21, 1987 [JP] Japan ................. 62-181963

[51] Int. Cl.$^5$ .............................................. G11C 29/00
[52] U.S. Cl. .................................. 365/201; 371/21.2; 371/22.2
[58] Field of Search .................... 365/201; 371/10, 13, 371/21

[56]  References Cited

U.S. PATENT DOCUMENTS 4,320,507  6/1982  Fukushima et al. ................... 371/21
4,459,694  7/1984  Ueno et al. ........................... 365/201

Primary Examiner—James W. Moffitt

Attorney, Agent, or Firm—Armstrong, Nikaido, Marmelstein, Kubovcik & Murray

[57] ABSTRACT

A programmable device has a cell formation region having rows and columns of programmable cells arranged in a matrix arrangement, a real cell region within the cell formation region and constituted by the programmable cells which are to be actually programmed, a test bit region within the cell formation region and including a number of rows of the programmable cells so as to include all kinds of the programmable cells within the real cell region, and a test word region within the cell formation region and including a number of columns of the programmable cells so as to include all kinds of the programmable cells within the real cell region. All of the programmable cells within the real cell region can essentially be tested by testing the programmable cells within the test bit region and the test word region.

7 Claims, 10 Drawing Sheets

PROGRAMMABLE DEVICE AND METHOD OF TESTING PROGRAMMABLE DEVICE

BACKGROUND OF THE INVENTION

The present invention generally relates to programmable devices and methods of testing programmable devices, and more particularly to a programmable device having programmable cells and a method of testing such a programmable device.

Recently, there are field programmable devices which are easily programmable at the time of designing each device. An example of the field programmable device is a programmable read only memory (PROM).

FIGS. 1A through 1D are cross sectional views for explaining production processes of a single programmable cell of the conventional PROM using a fuse.

Figure 1A:
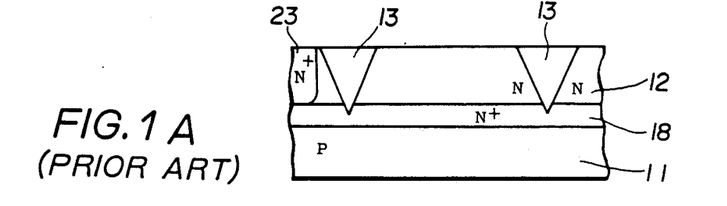
FIGS. 1A through 1D are cross sectional views respectively showing essential processes of producing a programmable cell of the conventional programmable device.

In FIG. 1A, an N+-type buried layer 18 is formed on a P-type semiconductor substrate 11, and an N-type epitaxial layer 12 is formed on the N+-type buried layer 18. V-grooves 13 are formed in the N-type epitaxial layer 12 and reaches the N+-type buried layer 18. In addition, an N+-type collector region 23 is formed in the N-type epitaxial layer 12 and extends to the N+-type buried layer 18.

Figure 1B:
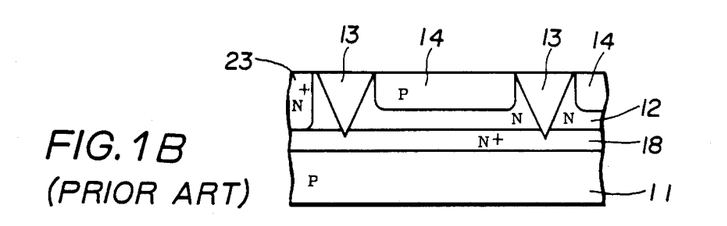

In FIG. 1B, a P-type base region 14 is formed within each region of the N-type epitaxial layer 12 isolated by the V-grooves 13.

Figure 1C:
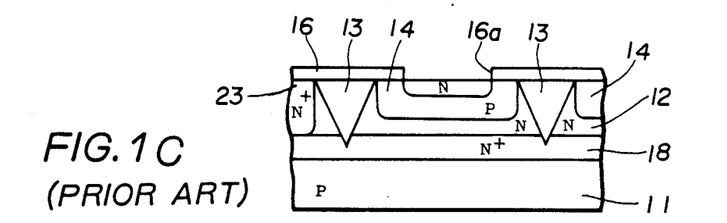

In FIG. 1C, a SiO2 oxide layer 16 is formed on the N-type epitaxial layer 12, and a window 16a is formed in the oxide layer 16. An N-type emitter region 15 is formed in the P-type base region through the window 16a.

Figure 1D:
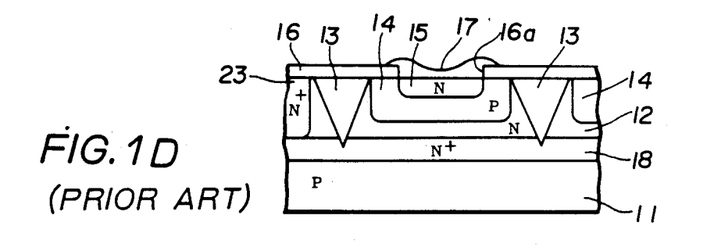

In FIG. 1D, an emitter electrode 17 is formed on the N-type emitter region 15.

A write operation with respect to the programmable cell shown in FIG. 1D is carried out by passing a current between the emitter and collector of the programmable cell. That is, a reverse current flows to the P-type base region 14 from the N-type emitter region 15 so as to break down a PN junction thereof.

Figure 2:
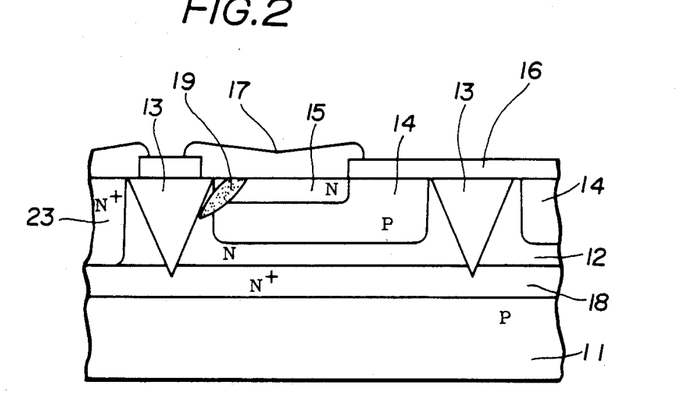
FIG. 2 is a cross sectional view on an enlarged scale showing the programmable cell which is produced when a positioning error of the mask occurs during the production of the conventional programmable device.

However, when a positioning error of the mask or the like occurs, the N-type emitter region 15 may become close to the V-groove 13 and a gap between the N-type epitaxial layer 12 and the N-type emitter region 15 may become extremely small as shown in FIG. 2. In this case, a current flows in a vicinity of a boundary between the programmable cell and the V-groove 13 when carrying out a write operation with respect to the programmable cell, thereby generating an eutectic 19 of semiconductor and aluminum of the emitter electrode 17. As a result, the N-type emitter region 15 and the N-type epitaxial layer 12 becomes short-circuited, that is, an overprogramming occurs. Therefore, the programmable cell is no longer a diode, and it is impossible to carry out the write operation accurately.

For this reason, when the programmable device is produced, it is necessary to test the programmable device for deficiencies existing therein. However, because it is impossible to directly test a real cell region in which the actual programming takes place, the test is made by use of a cell region other than the real cell region and peripheral circuits such as a write circuit of the programmable device.

Figure 3A:
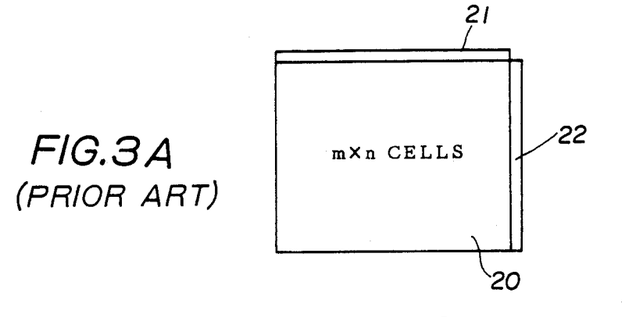
FIGS. 3A and 3B are a block diagram of the conventional programmable device and a plan view on an enlarged scale showing a portion of the conventional programmable device.
Figure 3B:
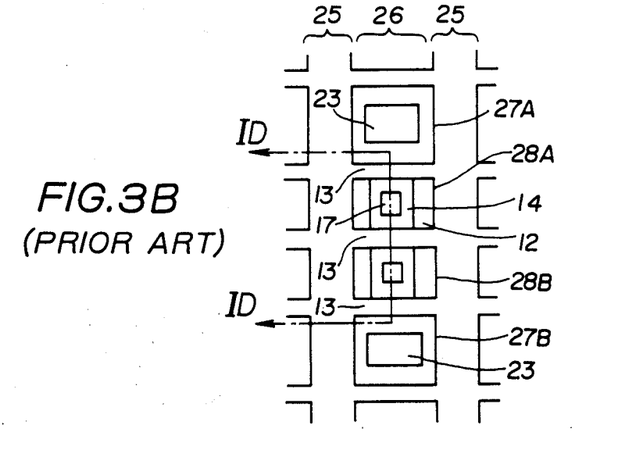

FIG. 3A is a block diagram showing the general construction of the conventional programmable device, and FIG. 3B shows a portion of the conventional programmable device on an enlarged scale.

In FIG. 3A, the programmable device has a real cell region 20, a test cell row 21 made up of a row of cells, and a test cell column 22 made up of a column of cells. The real cell region 20 is made up of m rows by n columns of cells arranged in a matrix arrangement. Although not shown, word lines are provided along a direction in which the columns of cells extend and bit lines are provided along a direction in which the rows of cells extend.

The test cell row 21 and the test cell column 22 are used exclusively for testing the write operation of the programmable device, and although not shown, there are also provided test cell row and column used exclusively for testing the read operation of the programmable device. For convenience sake, a description of the test cell row and column used exclusively for testing the read operation of the programmable device will be omitted. The test cell row 21 is made up of cells having the same construction as the rows of cells in the real cell region 20, and the test cell column 22 is made up of cells having the same construction as the columns of cells in the real cell region 20, assuming that there is no positioning error of the mask during the production of the programmable device. Hence, by testing the cells in the test cell row 21 and the test cell column 22, it is possible to essentially test the cells in the real cell region 20.

In FIG. 3B, a cell column 26 is provided between deep V-grooves 25. The cell column 26 has two cells 28A and 28B between collector contact portions 27A and 27B and these two cells 28A and 28B are isolated by the V-grooves 13 which are shallow compared to the V-grooves 25. The cross sectional view shown in FIG. 1D is taken along a line ID—ID in FIG. 3B, and in FIG. 3B, those parts which are the same as those corresponding parts in FIG. 1D are designated by the same reference numerals.

In the cell column 26, the cell 28A located below the collector contact portion 27A and the cell 28B located above the collector contact portion 27B have symmetrical shapes about the V-groove 13 formed between the cells 28A and 28B. For this reason, when a positioning error of the mask occurs in a direction along the cell colomn 26, the shapes of the cells 28A and 28B do not necessarily become the same.

The conventional programmable device such as the PROM only has one test cell row 21 and one test cell column 22 as shown in FIG. 3A. Hence, when a positioning error of the mask occurs during the production of the programmable device and the test cell row 21 is made up of a plurality of the cell 28A located below the collector contact portion 27A shown in FIG. 3B, for example, the test cannot be carried out with respect to the cell 28B located above the collector contact portion 27B. As a result, there is a problem in that the test cannot be carried out with respect to all of the cells in the real cell region 20.

SUMMARY OF THE INVENTION

Accordingly, it is a general object of the present invention to provide a novel and useful programmable device and method of testing programmable device in which the problems described heretofore are eliminated.

Another and more specific object of the present invention is to provide a programmable device in which a test can be carried out with respect to all cells in a real cell region. According to the programmable device of the present invention, it is possible to detect even a deficiency of the programmable device generated by a positioning error of a mask during the production process of the programmable device.

Still another object of the present invention is to provide a programmable device comprising a cell formation region having a plurality of rows and columns of programmable cells arranged in a matrix arrangement, each of the rows of the programmable cells having at least a first number of kinds of the programmable cells, each of the columns of the programmable cells having at least a second number of kinds of the programmable cells, where at least one of the first number and the second number is a plural number, a plurality of bit lines provided along corresponding ones of the rows of the programmable cells, a plurality of word lines provided along corresponding ones of the columns of the programmable cells, a real cell region within said cell formation region and constituted by the programmable cells which are to be actually programmed, a test bit region within the cell formation region and including a number of rows of the programmable cells equal to the first number so as to include all kinds of the programmable cells in the columns within the real cell region, a test word region within the cell formation region and including a number of columns of the programmable cells equal to the second number so as to include all kinds of the programmable cells in the rows within the real cell region, a real write circuit connected to the bit lines corresponding to the programmable cells within the real cell region for carrying out a write operation with respect to the programmable cells within the real cell region, a test write circuit connected to the bit lines corresponding to the programmable cells within the test bit region for carrying out a test write operation with respect to the programmable cells within the test bit region, a real word driver connected to the word lines corresponding to the programmable cells within the real cell region for driving the word lines, and a test word driver connected to the word lines corresponding to the programmable cells within the test word region for driving the word lines. According to the programmable device of the present invention, it is possible to essentially test all of the kinds of the programmable cells within the real cell region.

A further object of the present invention is to provide a method of testing a programmable device in which a test is carried out with respect to all cells in a real cell region. According to the method of the present invention, it is possible to detect even a deficiency of the programmable device generated by a positioning error of a mask during the production process of the programmable device.

Another object of the present invention is to provide a method of testing a programmable device which comprises a cell formation region having a plurality of rows and columns of programmable cells arranged in a matrix arrangement, each of the rows of the programmable cells having at least a first number of kinds of the programmable cells, each of the columns of the programmable cells having at least a second number of kinds of the programmable cells, where at least one of the first number and the second number is a plural number, a real cell region within the cell formation region and constituted by the programmable cells which are to be actually programmed, a test bit region within the cell formation region and including a number of rows of the programmable cells equal to the first number so as to include all kinds of the programmable cells within the real cell region, and a test word region within the cell formation region and including a number of columns of the programmable cells equal to the second number so as to include all kinds of the programmable cells within the real cell region, the method comprising the steps of writing test data into each of the programmable cells within the test bit region and the test word region, and reading out the test data from each of the programmable cells within the test bit region and the test word region. According to the method of the present invention, it is possible to essentially test all of the kinds of the programmable cells within the real cell region.

Other objects and further features of the present invention will be apparent from the following detailed description when read in conjunction with the accompanying drawings.

DETAILED DESCRIPTION

Figure 4:
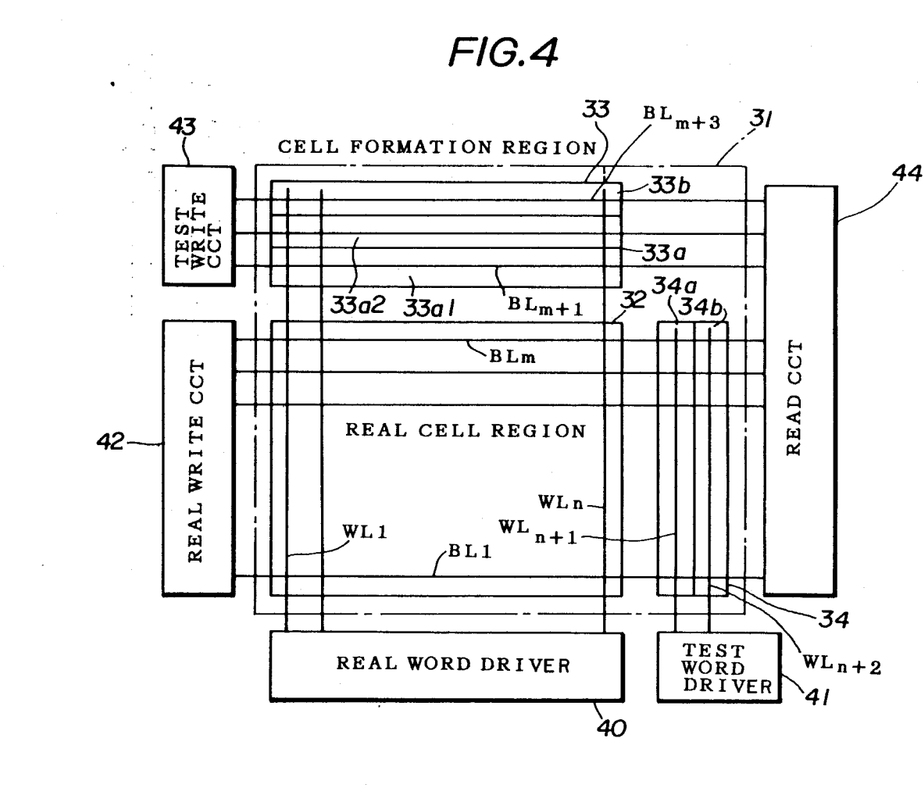
FIG. 4 is a system block diagram generally showing a first embodiment of the programmable device according to the present invention.

FIG. 4 generally shows a first embodiment of the programmable device according to the present invention. The programmable device has a real cell region 32, a test bit region 33 and a test word region 34 provided within a cell formation region 31. The programmable device further has a real word driver 40, a test word driver 41, a real write circuit 42, a test write circuit 43 and a read circuit 44. The test bit region 33 has a first test bit region 33a used for the write test and a second test bit region 33b used for the read test. Similarly, the test word region 34 has a first test word region 34a used for the write test and a second test word region 34b used for the read test. In FIG. 4, $BL_1$ through $BL_{m+3}$ denote bit lines, and $WL_1$ through $WL_{n+2}$ denote word lines.

Figure 5A:
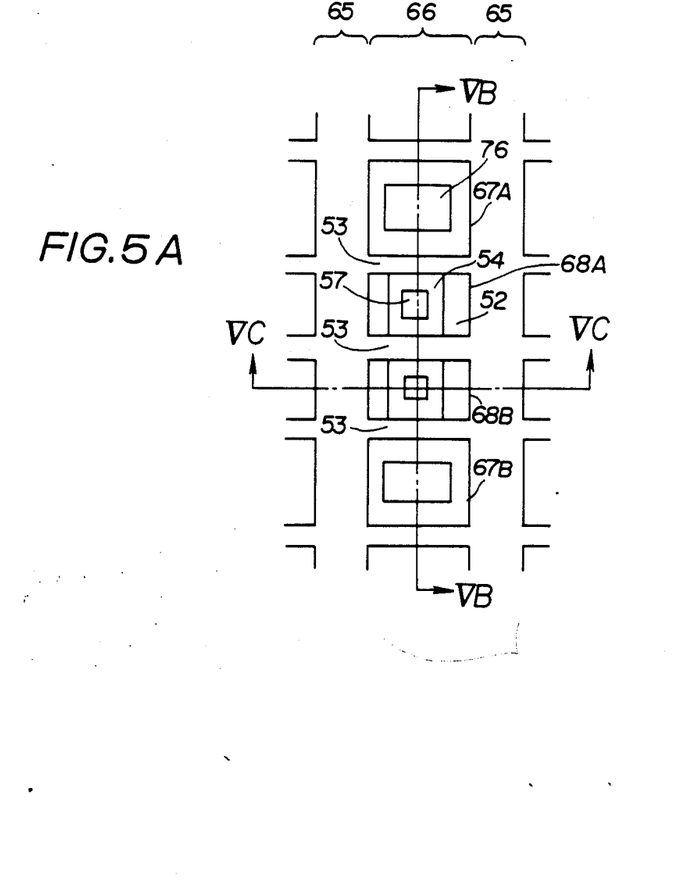
FIG. 5A is a plan view showing an essential part of the first embodiment.
Figure 5B:
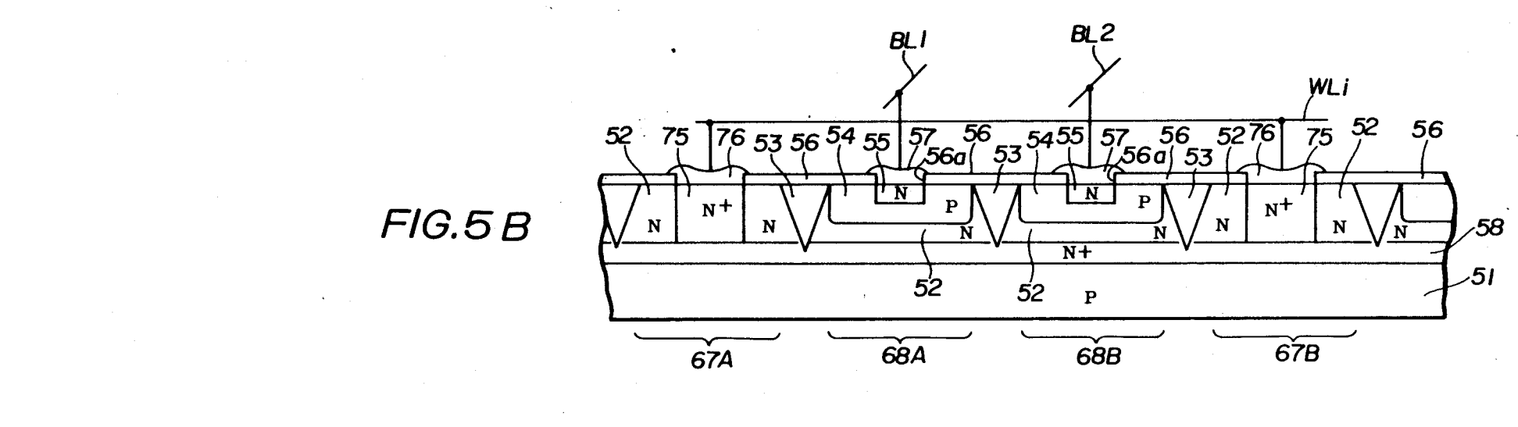
FIG. 5B is a cross sectional view showing a portion of the first embodiment along a line VB-VB in FIG. 5A.
Figure 5C:
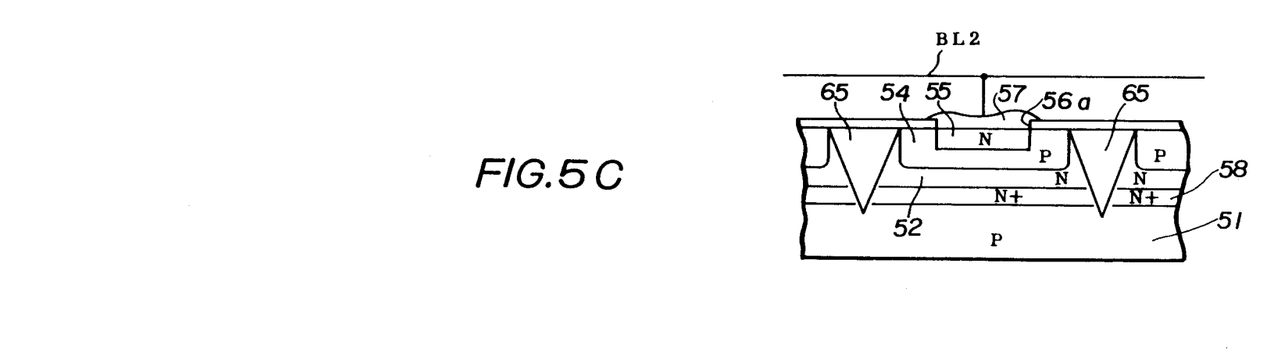
FIG. 5C is a cross sectional view showing a portion of the first embodiment along a line VC-VC in FIG. 5A.

The cell formation region 31 has a plurality of cell columns 66 having a construction shown in FIGS. 5A through 5C. The construction of the cell column 66 is basically the same as the cell column 26 shown in FIG. 3B. In FIG. 5A, the cell column 66 is provided between deep V-grooves 65. The cell column 66 has two cells 68A and 68B between collector contact portions 67A and 67B and these two cells 68A and 68B are isolated by V-grooves 53 which are shallow compared to the V-grooves 65. In the cell column 66, the cell 68A located below the collector contact portion 67A and the cell 68B located above the collector contact portion 67B have symmetrical shapes about the V-groove 53 formed between the cells 68A and 68B. However, when a positioning error of the mask occurs in a direction along the cell column 66 during the production process, the shapes of the cells 68A and 68B do not necessarily become the same.

FIG. 5B shows a cross sectional view along a line VB-VB in FIG. 5A, and FIG. 5C shows a cross sectional view along a line VC-VC in FIG. 5A.

In FIG. 5B, an $N^+$-type buried layer 58 is formed on a P-type semiconductor substrate 51, and an N-type epitaxial layer 52 is formed on the $N^+$-type buried layer 58. The V-grooves 53 are formed in the N-type epitaxial layer 52 and reaches the $N^+$-type buried layer 58. In addition, an $N^+$-type collector region 75 is formed in the N-type epitaxial layer 52 and extends to the $N^+$-type buried layer 58. A P-type base region 54 is formed within each region of the N-type epitaxial layer 52 isolated by the V-grooves 53. A $SiO_2$ oxide layer 56 is formed on the N-type epitaxial layer 52, and a window 56a is formed in the oxide layer 56. An N-type emitter region 55 is formed in the P-type base region through the window 56a. An emitter electrode 57 is formed on the N-type emitter region 55. In each of the collector contact portions 67A and 67B, an $N^+$-type collector region 75 is formed within the N-type epitaxial layer 52, and the $N^+$-type collector region 75 is in contact with the $N^+$-type buried layer 58. A collector electrode 76 is formed on each $N^+$-type collector region 75.

All of the collector electrodes 76 in the cell row 66 are connected to a corresponding word line $WL_i$ which runs vertically in FIGS. 4 and 5A. On the other hand, the emitter electrodes 57 are connected to corresponding ones of the bit lines $BL_1$, $BL_2$, ... which run horizontally in FIGS. 4 and 5A. In other words, a plurality of the cells 68A and 68B are arranged in a matrix arrangement within the cell formation region 31.

Returning now to the description of FIG. 4, the real cell region 32 is made up of n cell columns 66 each having a total of m cells which include the cells 68A and 68B. The first test bit region 33a used for the write test have two cell rows 33a1 and 33a2 corresponding to the (m+1)th row and the (m+2)th row. The cell row 33a1 is made up of the cells 28A (or 28B) of each of the n cell columns 66, and the cell row 33a2 is made up of the cells 28B (or 28A) of each of the n cell columns 66. The second test bit region 33b used for the read test has one cell row made up of the cells 28A or 28B. The first test word region 34a used for the write test is made up of the cells 28A and 28B of the (n+1)th cell column 66, and the second test word region 34b used for the read test is made up of the cells 28A and 28B of the (n+2)th cell column 66.

The word lines $WL_l$ through $WL_n$ corresponding to the first through nth cell columns of the cell formation region 31 are connected to the real word driver 40. The word lines $WL_{n+1}$ and $WL_{n+2}$ corresponding to the (n+1)th and (n+2)th cell columns of the cell formation region 31 are connected to the test word driver 41. In addition, the bit lines $BL_1$ through $BL_m$ corresponding to the first through mth cell rows of the cell formation region 31 are connected to the real write circuit 42, and the bit lines $BL_{m+1}$ through $BL_{m+3}$ corresponding to the (m+1)th through (m+3)th cell rows of the cell formation region 31 are connected to the test write circuit 43. Furthermore, all of the bit lines $BL_1$ through $BL_{m+3}$ are connected to the read circuit 44.

When testing the programmable device, a write operation is carried out with respect to all of the cells 68A and 68B within the first test bit region 33a by use of the test write circuit 43 and the real word driver 40, and in addition, a write operation is carried out with respect to all of the cells 68A and 68B within the first test word region 34a by use of the real write circuit 42 and the test word driver 41. Moreover, the written contents are read out from each of the cells 68A and 68B within the first test bit region 33a and the first test word region 34a by use of the real word driver 40, the test word driver 41 and the read circuit 44. Hence, it is possible to compare the read out data with the test data written during the test and effectively detect any deficiency of the cells 68A and 68B within the real cell region 32 and the write system of the programmable device.

According to the present embodiment, two kinds of cells 68A and 68B which may have the mutually different patterns when the positioning error of the mask occurs during the production process exist in each cell column 66. But because the first test bit region 33a includes both kinds of cells 68A and 68B in the cell rows 33a1 and 33a2, it is possible to effectively test all of the cells 68A and 68B in the columns within the real cell region 32 by use of the first test bit region 33a. On the other hand, only one kind of cell exists in one cell row, and it is thus possible to effectively test all of the cells 68A and 68B of the rows within the real cell region 32 by use of the first test word region 34a.

Although not directly related to the present invention, predetermined data may be written beforehand in the cells 68A (or 68B) within the second test bit region 33b and in the cells 68A and 68B within the second test word region 34b. By reading out the pre-stored data from the cells 68A and 68B within the second test bit region 33b and the second test word region 34b, it is possible to detect any deficiency in the read system of the programmable device. The system for testing the read system of the programmable device is further disclosed in the U.S. Pat. No. 4,320,507, the disclosure of which is hereby incorporated by reference.

Figure 6:
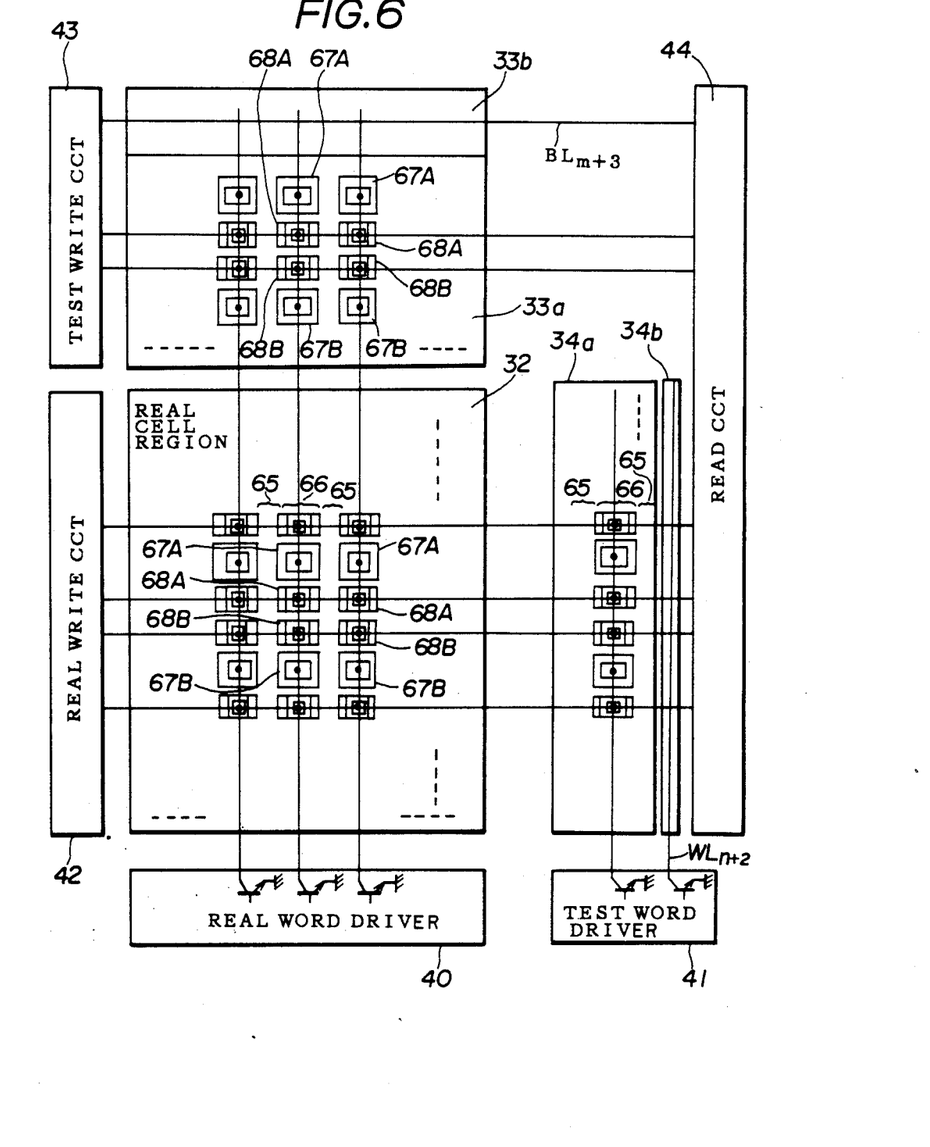
FIG. 6 is a block diagram in partial plan view showing cells at essential parts of the first embodiment.

FIG. 6 shows the cells 68A and 68B at essential parts of the first embodiment to facilitate the understanding of the relationship of FIGS. 4 and FIGS. 5A through 5C.

Figure 7:
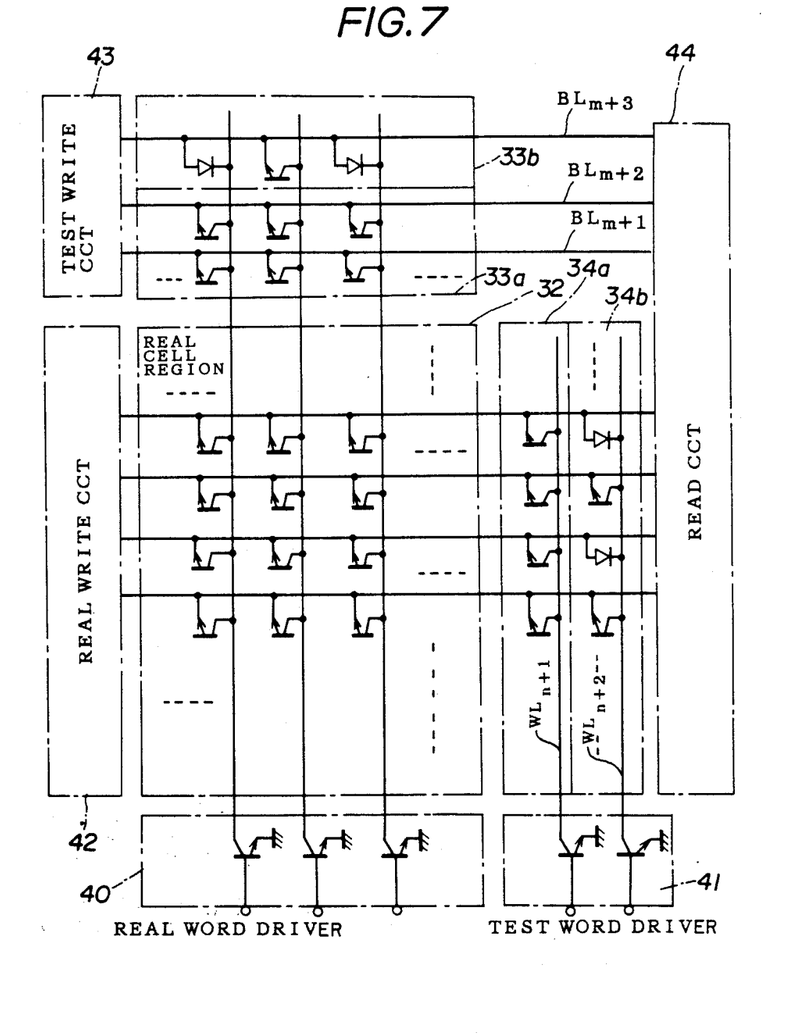
FIG. 7 is a circuit diagram showing circuit equivalents of the cells at essential parts of the first embodiment.

FIG. 7 shows circuit equivalents of the cells 68A and 68B at essential parts of the first embodiment.

Figure 8:
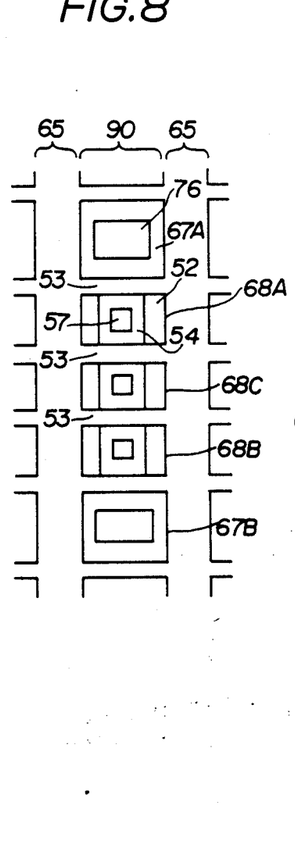
FIG. 8 is a plan view showing an essential part of the second embodiment.

Next, a description will be given of a second embodiment of the programmable device according to the present invention, by referring to FIG. 8. In the present embodiment, three kinds of cells 68A, 68B and 68C exist between the collector contact portions 67A and 67B in each cell column 90 as shown in FIG. 8. In FIG. 8, those parts which are the same as those corresponding parts in FIG. 5A are designated by the same reference numerals, and a description thereof will be omitted.

In the case of the present embodiment, a test bit region corresponding to the test bit region 33a shown in FIG. 4 must be made up of three cell rows respectively having the cells 68A, 68B and 68C, so that it is possible to carry out the test with respect to essentially all of the cells 68A, 68B and 68C within a real cell region. Since the remaining parts of the programmable device are the same as those corresponding parts of the programmable device shown in FIG. 4, illustration and description of the block system of the second embodiment will be omitted.

Figure 9:
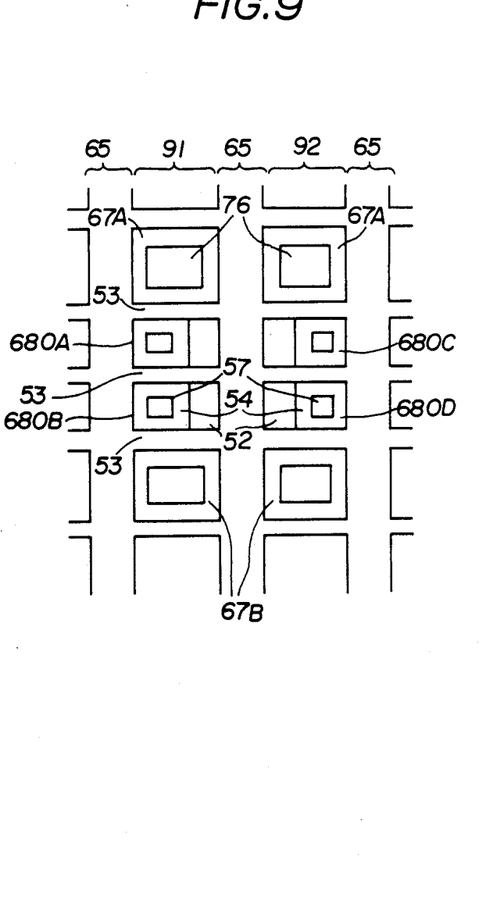
FIG. 9 is a plan view showing an essential part of the third embodiment.

Next, a description will be given of a third embodiment of the programmable device according to the present invention, by referring to FIG. 9. In the present embodiment, two kinds of cells 680A, 680B exist between the collector contact portions 67A and 67B in a cell column 91 and two kinds of cells 680C and 680D exist between the collector contact portions 67A and 67B in a cell column 92 as shown in FIG. 9. The cells 680A and 680B respectively are symmetrical about the deep groove 65 located between the cell columns 91 and 92. In other words, four kinds of cells exist in two mutually adjacent cell columns 91 and 92. In FIG. 9, those parts which are the same as those corresponding parts in FIG. 5A are designated by the same reference numerals, and a description thereof will be omitted.

Figure 10:
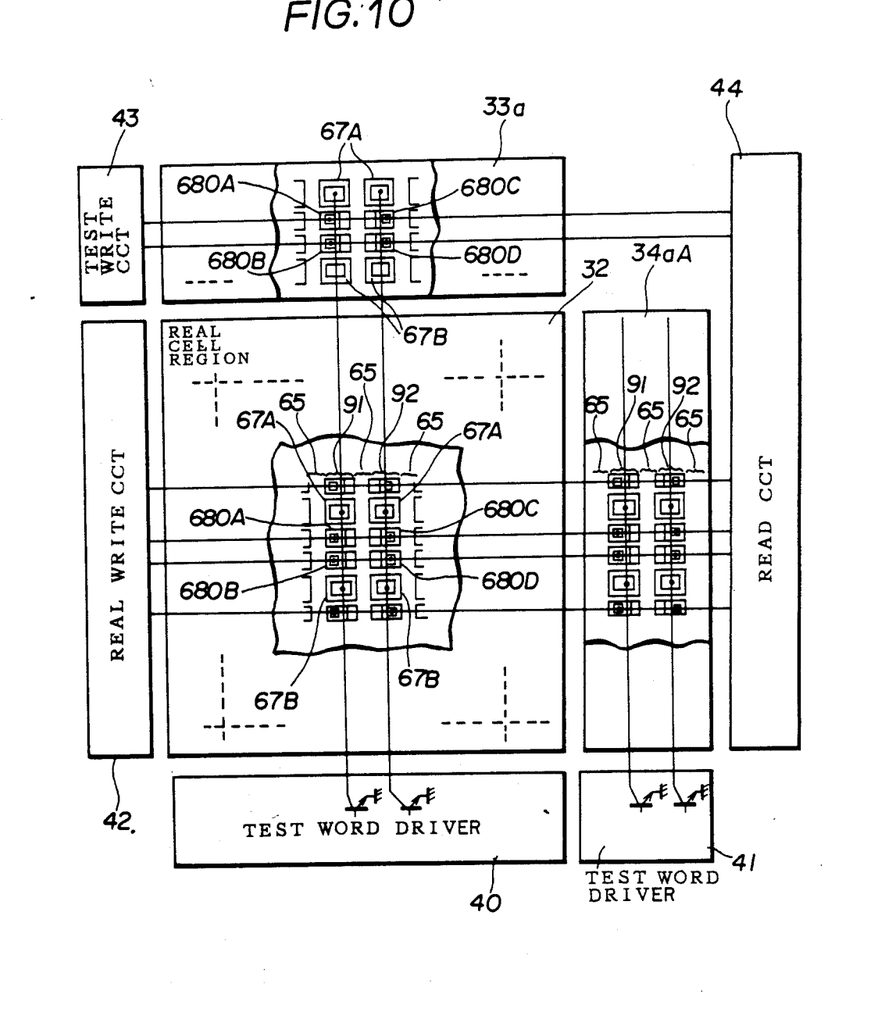
FIG. 10 is a block diagram in partial plan view showing cells at essential parts of the third embodiment.

In the case of the present embodiment, a test word region 34aA shown in FIG. 10 must be made up of two cell rows respectively having the cells 680A and 680B and the cells 680C and 680D, so that it is possible to carry out the test with respect to essentially all of the cells 680A, 680B, 680C and 680D within a real cell region. The remaining parts of the programmable device are the same as those corresponding parts of the programmable device shown in FIG. 4. FIG. 10 shows the cells 680A, 680B, 680C and 680D at essential parts of the third embodiment to facilitate the understanding of the relationship of the cells 680A through 680D and the block system of the third embodiment. Further, the illustration of the test bit region 33b and the test word region 34b used for read test is omitted in FIG. 10.

As may be understood from the described embodiments of the programmable device, the method of testing the programmable device according to the present invention writes test data into each of the programmable cells within the test bit region and the test word region, and then reads out the test data from each of the programmable cells within the test bit region and the test word region. Hence, it is possible to essentially detect deficiencies in all of the programmable cells within the real cell region and the write system of the programmable device by comparing the test data which are actually read out with the test data which were written.

Therefore, according to the present invention, all of the kinds of cells within the real cell region of the programmable device are included in the test bit region and the test word region of the programmable device, thereby making it possible to essentially test all of the kinds of the cells within the real cell region by testing the cells in the test bit region and the test word region. In addition, it is possible to test the peripheral circuits of the programmable device such as the real word driver and the real write circuit.

Further, the present invention is not limited to these embodiments, but various variations and modifications may be made without departing from the scope of the present invention.

What is claimed is:

1. A programmable device comprising:

a cell formation region having a plurality of rows and columns of programmable cells arranged in a matrix arrangement, each of the rows of the programmable cells having at least a first number of kinds of the programmable cells, each of the columns of the programmable cells having at least a second number of kinds of the programmable cells, at least one of the first number and the second number being a plural number;

a plurality of bit lines provided along corresponding ones of the rows of the programmable cells;

a plurality of word lines provided along corresponding ones of the columns of the programmable cells;

a real cell region within said cell formation region and constituted by the programmable cells which are to be actually programmed;

a test bit region within said cell formation region and including a number of rows of the programmable cells equal to said first number so as to include all kinds of the programmable cells in the columns within said real cell region;

a test word region within said cell formation region and including a number of columns of the programmable cells equal to said second number so as to include all kinds of the programmable cells in the rows within said real cell region;

a real write circuit connected to the bit lines corresponding to the programmable cells within said real cell region for carrying out a write operation with respect to the programmable cells within said real cell region;

a test write circuit connected to the bit lines corresponding to the programmable cells within said test bit region for carrying out a test write operation with respect to the programmable cells within said test bit region;

a real word driver connected to the word lines corresponding to the programmable cells within said real cell region for driving the word lines; and a test word driver connected to the word lines corresponding to the programmable cells within said test word region for driving the word lines.

2. A programmable device as claimed in claim 1 in which the kinds of the programmable cells have mutually different patterns.

3. A programmable device as claimed in claim 1 in which each of said columns of the programmable cells have a collector contact portion of the programmable cell provided for every said first number of the programmable cells.

4. A programmable device as claimed in claim 1 in which each of the programmable cells have a substrate of a first semiconductor type, a buried layer doped to a second semicondutor type and formed on said substrate, an epitaxial layer of the second semiconductor type formed on said buried layer, shallow V-grooves formed in said epitaxial layer and extending partially into said buried layer, a base region of the first semiconductor type and formed in a region of said epitaxial layer isolated by said shallow V-grooves, an emitter region of the second semiconductor type and formed in said base region, and a collector region doped to the second type semiconductor and formed in said epitaxial layer and making contact with said buried layer.

5. A programmable device as claimed in claim 4 in which each of said columns of the programmable cells have a collector contact portion provided for every said first number of the programmable cells, said collector contact portion being formed on said collector region of each programmable cell.

6. A programmable device as claimed in claim 1 which further comprises a read circuit for reading out data from the programmable cells within said cell formation region, said test bit region further having at least one row of the programmable cells which are programmed in advance, said test word region further having at least one column of the programmable cells which are programmed in advance.

7. A method of testing a programmable device which comprises a cell formation region having a plurality of rows and columns of programmable cells arranged in a matrix arrangement, each of the rows of the programmable cells having at least a first number of kinds of the programmable cells, each of the columns of the programmable cells having at least a second number of kinds of the programmable cells, at least one of the first number and the second number being a plural number, a real cell region within said cell formation region and constituted by the programmable cells which are to be actually programmed, a test bit region within said cell formation region and including a number of rows of the programmable cells equal to said first number so as to include all kinds of the programmable cells within said real cell region, and a test word region within said cell formation region and including a number of columns of the programmable cells equal to said second number so as to include all kinds of the programmable cells within said real cell region, said method comprising the steps of:

writing test data into each of the programmable cells within said test bit region and said test word region; and reading out the test data from each of the programmable cells within said test bit region and said test word region.

* * * * *